United States Patent [19]

Misawa et al.

[11] Patent Number: 4,524,860
[45] Date of Patent: Jun. 25, 1985

[54] AUTOMATIC BOARD TRANSFER APPARATUS

[75] Inventors: Yoshihiko Misawa, Osaka; Makito Seno, Hirakata; Koji Fujiwara, Yamatokouriyama, all of Japan

[73] Assignee: Matsushita Electric Industrial Co., Ltd., Osaka, Japan

[21] Appl. No.: 440,218

[22] PCT Filed: Feb. 23, 1982

[86] PCT No.: PCT/JP82/00049

§ 371 Date: Oct. 22, 1982

§ 102(e) Date: Oct. 22, 1982

[87] PCT Pub. No.: WO82/02992

PCT Pub. Date: Sep. 2, 1982

[30] Foreign Application Priority Data

Feb. 23, 1981 [JP] Japan .................................. 56-25144

[51] Int. Cl.³ ............................................. B65G 25/02
[52] U.S. Cl. ...................................... 198/740; 198/692
[58] Field of Search ...................... 198/487, 692, 740; 271/232

[56] References Cited

U.S. PATENT DOCUMENTS

| | | | |
|---|---|---|---|
| 3,308,922 | 3/1967 | Ellis et al. | 198/487 |
| 4,200,180 | 4/1980 | Dixon | 198/487 |
| 4,340,137 | 7/1982 | Misawa | 198/487 |

Primary Examiner—Joseph E. Valenza
Assistant Examiner—Kyle E. Shane
Attorney, Agent, or Firm—Wenderoth, Lind & Ponack

[57] ABSTRACT

An automatic board transfer apparatus transfers, positions and delivers boards and comprises an arm which is reciprocable along guides for horizontally guiding the boards and which is vertically movable perpendicularly to the plane of the boards. A pusher and a pin are installed on the arm. The board is transferred in advance along the guides by the pusher and on the way a pin is inserted into the reference hole of the board to thereby transfer the board. Thus, variations in the position of the reference hole of the board caused by reversing the board and variations in board length are accommodated without adjustment, thus making continuous production possible.

3 Claims, 7 Drawing Figures

AUTOMATIC BOARD TRANSFER APPARATUS

TECHNICAL FIELD

The present invention relates to an automatic board transfer apparatus for transferring, positioning and delivering boards for mounting electronic parts on the boards, and has for its object the provision of an apparatus which permits continuous production while accommodating, without adjustment, variations in the position of a reference hole of the board caused by reversing the board and variations in board length.

BACKGROUND ART

A conventional apparatus for transferring and positioning print boards will be described with reference to FIG. 1. Print boards 1 are conveyed on a conveyor 2 and are positioned at the end of the conveyor 2 by a stop 3. Each print board 1 is provided with a reference hole 4 at a fixed position spaced from the front end surface as viewed in the transfer direction, and another reference hole 5 spaced a fixed pitch from the reference hole 4.

An X-Y table 6 is provided with guides 7 for the print boards 1, such guides being provided with a vertically movable positioning pin 8 for positioning the boards 1. At a fixed position spaced from the X-Y table 6, there is provided a rotatable shaft 9 extending along the guides 7, shaft 9 having an arm 10 axially slidably and rotatably installed thereon, arm 10 being vertically swingable as the shaft 9 is rotated. Further, the arm 10 is reciprocable in the direction of arrow X by an actuator 11 located parallel to the shaft 9. The ends of the shaft 9 are provided with stops 12 for positioning the arm 10 and shock absorbers 13. Rotation of the shaft 9 is effected by an actuator 15 swinging a lever 14 fixed to the shaft 9.

The operation will now be described. The arm 10 is provided with a pin (not shown) adapted to be inserted into the reference hole 4 of a print board 1 positioned on the conveyor 2 when the arm 10 is lowered. Then the actuator 11 is operated to move the arm 10 in the direction of arrow X', and the pin feeds and positions the print board. The arm 10 is then lifted by the actuator 15, and the positioning pins 8 are inserted into the reference holes 4 and 5 by a nonillustrated separate mechanism, to fix the print board 1 in position, the arm 10 being then returned to its original position by the actuator 11.

In this case, however, because of errors in the pitch between the reference holes 4 and 5, there are times when the positioning pins 8 on the guides 7 fail to enter the reference holes 4 and 5. As measure against this problem, generally the right-hand end reference hole 5 of the print board 1 is elongated. However, when parts are to be mounted on both surfaces of the print board 1, it is necessary to reverse the print board 1. Thus, the reference holes 4 and 5 changes their positions, with the reference hole 4 after transfer operation assuming the right-hand end position, so that each time the print board is reversed the stop 3 or arm 10 must be changed in shape to adjust the pin of arm 10 to the position of the reference hole 4. Another drawback is that each time the length of the print board 1 is changed, such adjustment is necessary.

The present invention eliminates these drawbacks and makes feeding and positioning possible also when the reference hole 4 of the print board 1 is at the right-hand end, irrespective of variations in the length of the print board 1.

SUMMARY OF THE INVENTION

The present invention relates to an automatic print board transfer apparatus for transferring, positioning and delivering print boards for mounting electronic parts on the print boards, the apparatus including an arm reciprocable along guides for horizontally guiding print boards and vertically movable substantially perpendicularly to the plane of a print board the arm being provided with a pusher and a pin. The arrangement is such that the print board is transferred to advance along the guides by the pusher, and on the way the pin is inserted into a reference hole of the print board to take over the transfer of the print board. As a result of this arrangement there is obtained the advantage that variations in the position of the reference hole of the print board caused by reversing the latter and variations in print board length can be accommodated without adjustment, making continuous production possible.

DETAILED DESCRIPTION OF THE INVENTION

Figure 1:
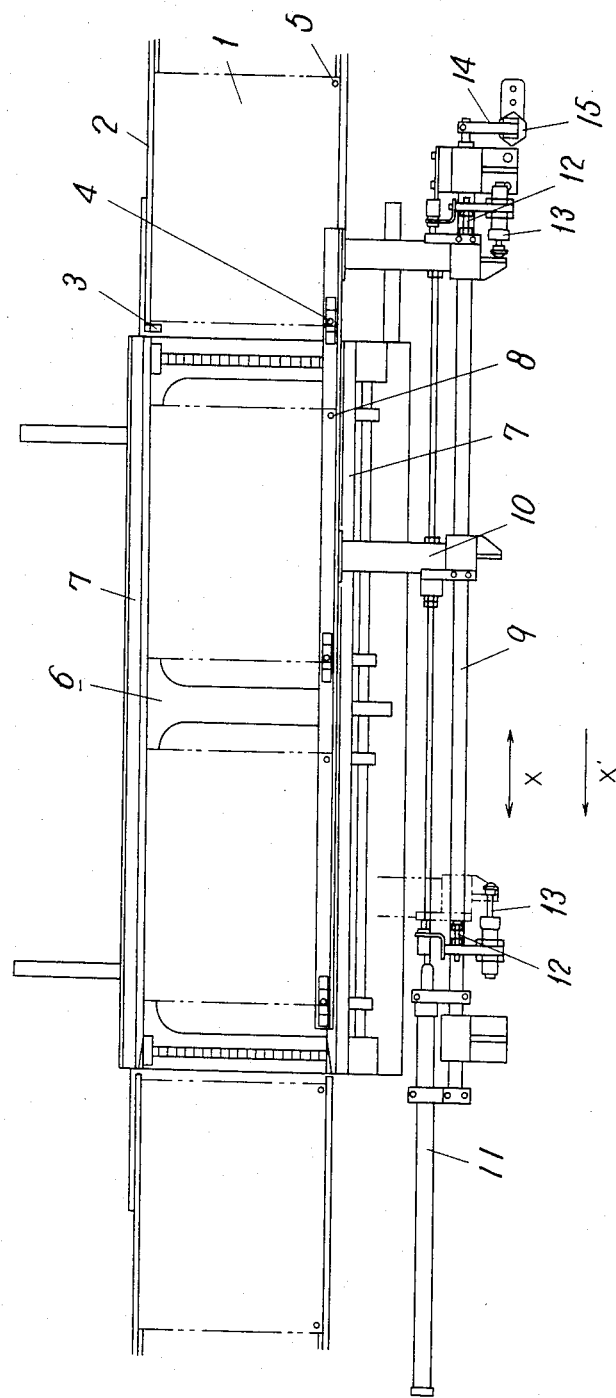
FIG. 1 is a plan view of a conventional automatic print board transfer apparatus.

An embodiment of the invention will be described with reference to FIGS. 2-7.

The numeral 1 denotes print boards, and 2 denotes a conveyer for transferring the print boards 1 to a predetermined position. The numeral 4 denotes a positioning reference hole formed in each print board 1 at a fixed position relative to the contour of the print boards 1 and the circuit pattern. The numeral 17 denotes an elongated hole provided at a fixed position with respect to reference hole 4 and elongated in the direction of arrow X to accommodate errors in the pitch between it and the reference hole 4. The reference hole 4 and elongated hole 17 are at the same position with respect to the direction of arrow Y, providing a reference for positioning the print boards 1 in the Y direction. The numeral 6 denotes an X-Y table adapted to be positioned in the X and Y directions by NC instructions. The numeral 7 denotes guides installed on the X-Y table 6 for holding the print boards 1. A conveyor delivers the print boards 1 from the X-Y table 6. The numeral 19 denotes a shaft rotatably supported by supports 20. A lever 21 fixed to shaft 19 is connected to an actuator 22, so that the expansion and contraction of the latter causes rotation of the shaft 19. Numeral 23 denotes an arm axially movably and rotatably attached to the shaft 19. The numerals 24 and 25 denote brackets fixing a cylinder 26 to the shaft 19. The rod 26a of this cylinder 26 is connected to the arm 23, so that the operation of the cylinder 26 causes the arm 23 to slide in the directions of arrow X. The characters 27 and 27a denote stops fixed to the opposite ends of the shaft 19 by blocks 28, serving to position the arm 23 in the X directions. The numerals 29 denote shock absorbers attached to the shaft 19 by the blocks 28, serving to absorb shocks produced during positioning of the arm 23 by abutment thereof with the stops 27 and 27a. The characters 30 and 30a denote switches fixed to the brackets 28, serving to detect the reciprocating movement of the arm 23. The characters 31 and 31a denote switches installed on one of the supports 20 and adapted to be turned on and off by the swinging movement of the lever 21 caused by the expansion and contraction of the actuator 22. Thus, such switches control the rotative angle of the shaft 19 connected to the lever 21 and control the vertical position of the arm 23 installed on the shaft 19. The numeral 32 denotes a pin vertically movable guided by a block 33 fixed to the arm 23. The distance between the center of the pin 32 and the surface of the pusher 34 which contacts the print board is equal to the distance from the contacted end surface of the print board to the center of the reference hole 4. Further, a lever 36 rotatable around the axis of a shaft 35 holds a small pin 37 fixed to the pin 32, so that the pin 32 is vertically movable by the rotation of the lever 36. Further, the lever 36 is subjected to a force urging the pin 32 downwardly in the direction of arrow Z (FIG. 5), by a spring 39 through a connecting rod 38. The numeral 40 denotes a rod rotatably supported by a block 41 fixed to the arm 23. The numeral 42 denotes a roller fixed to a lever 43. The lever 43 is fixed to an end of the rod 40 so that it is rotatable around the axis of the rod 40. The roller 42 is parallel to the shaft 19 and is in contact with a cam 44 supported by the support 20, so that roller 42 moves up and down in accordance with changes on the upper surface of the cam and thus swings the lever 43 and rotates the rod 40.

A lever 45 is fixed to the opposite end of rod 40 and is swingable around the axis to the rod 40 by the rotation of the latter. Lever 45 is connected to the connecting rod 38, thereby transmitting the movement of roller 42 to pin 32. The spring 39 rotates the rod 40 through the connecting rod 38 and lever 45, and constantly urges the roller 42 against the cam 44.

The operation will now be described.

The print board 1 is transferred on the conveyor 2 in the X' direction, and the conveyor 2 is stopped by a detector 46 so as to stop the print board 1. Subsequently, the shaft 19 is rotated by the actuator 22 through the lever 21 to lower the arm 23, so that the pusher 34 provided on the arm 23 is moved behind the print board 1. At this time, as shown in FIG. 3, the lever 21 turns on the switch 31a. Then, as shown in FIG. 2, the actuator 26 pulls the arm 23, while the pusher 34 moves in the X' direction, thus pushing the print board 1.

Figure 2:
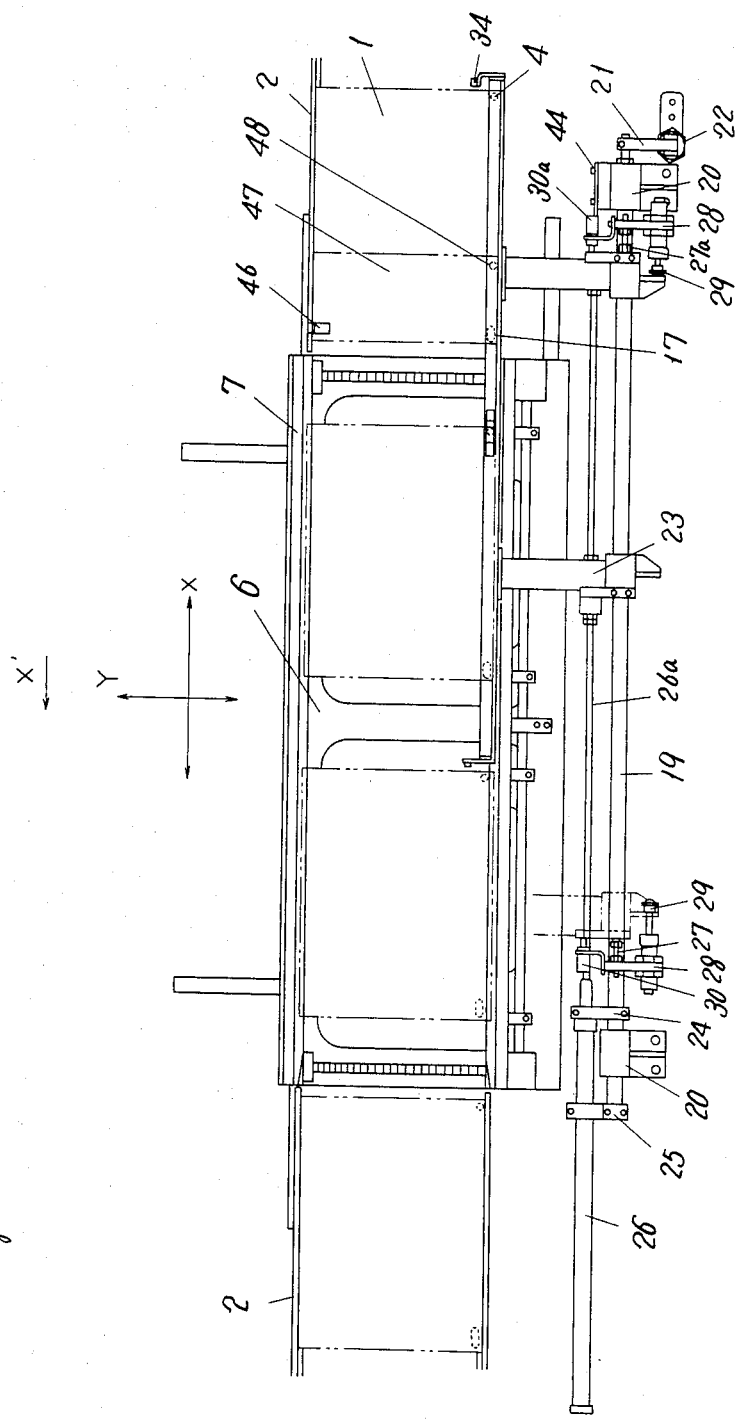
FIG. 2 is a plan view of an automatic print board transfer apparatus according to an embodiment of the present invention.
Figure 3:
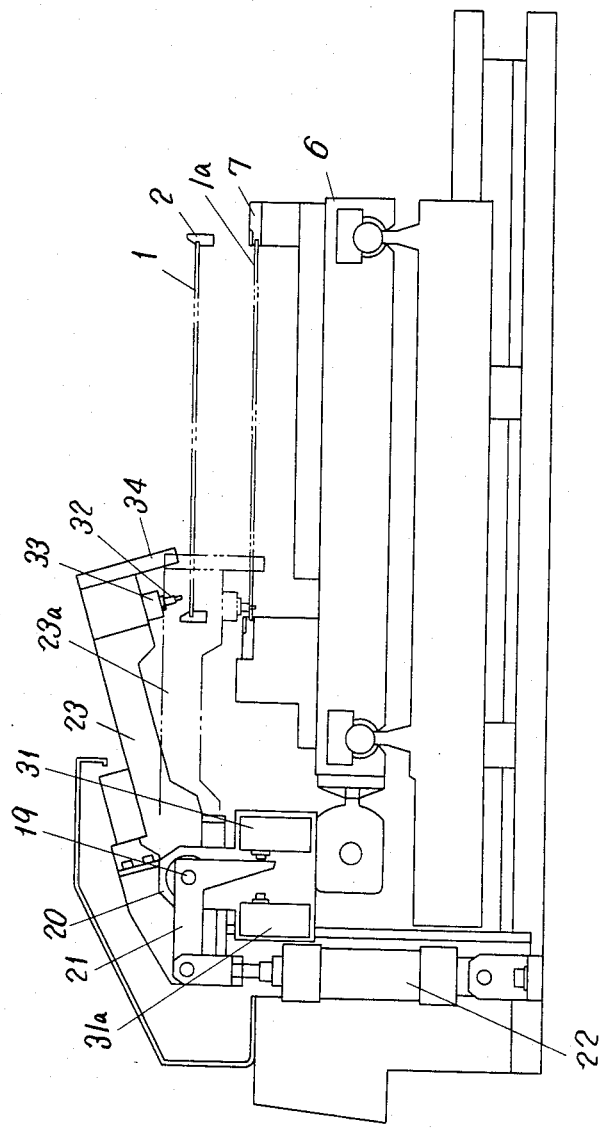
FIG. 3 is a side view of the same.
Figure 4:
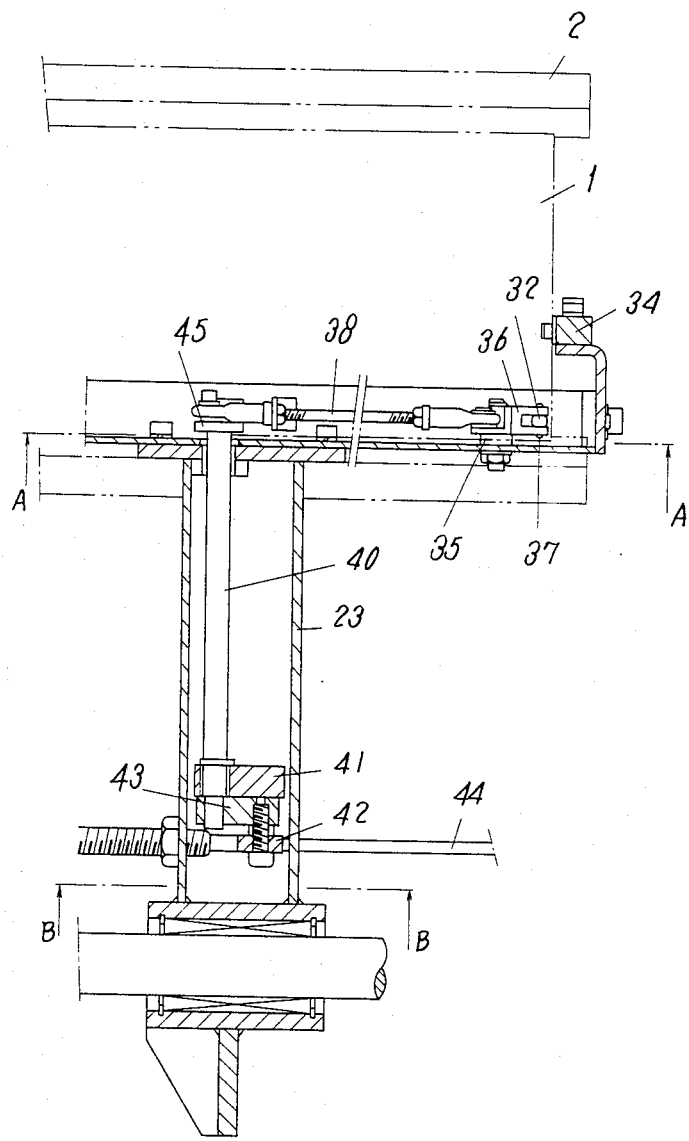
FIG. 4 is an enlarged plan view, in section, of the principal portion of an arm.
Figure 5:
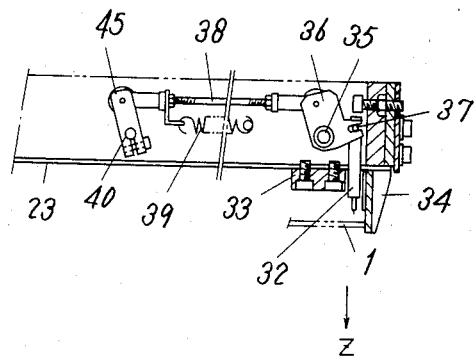
FIG. 5 is a sectional view taken along line A-A in FIG. 4.
Figure 6:
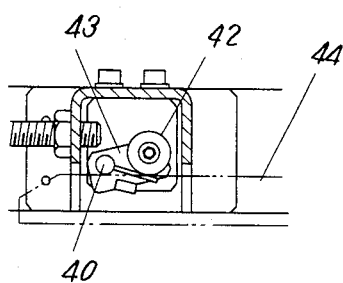
FIG. 6 is a sectional view taken along line B-B in FIG. 4.
Figure 7:
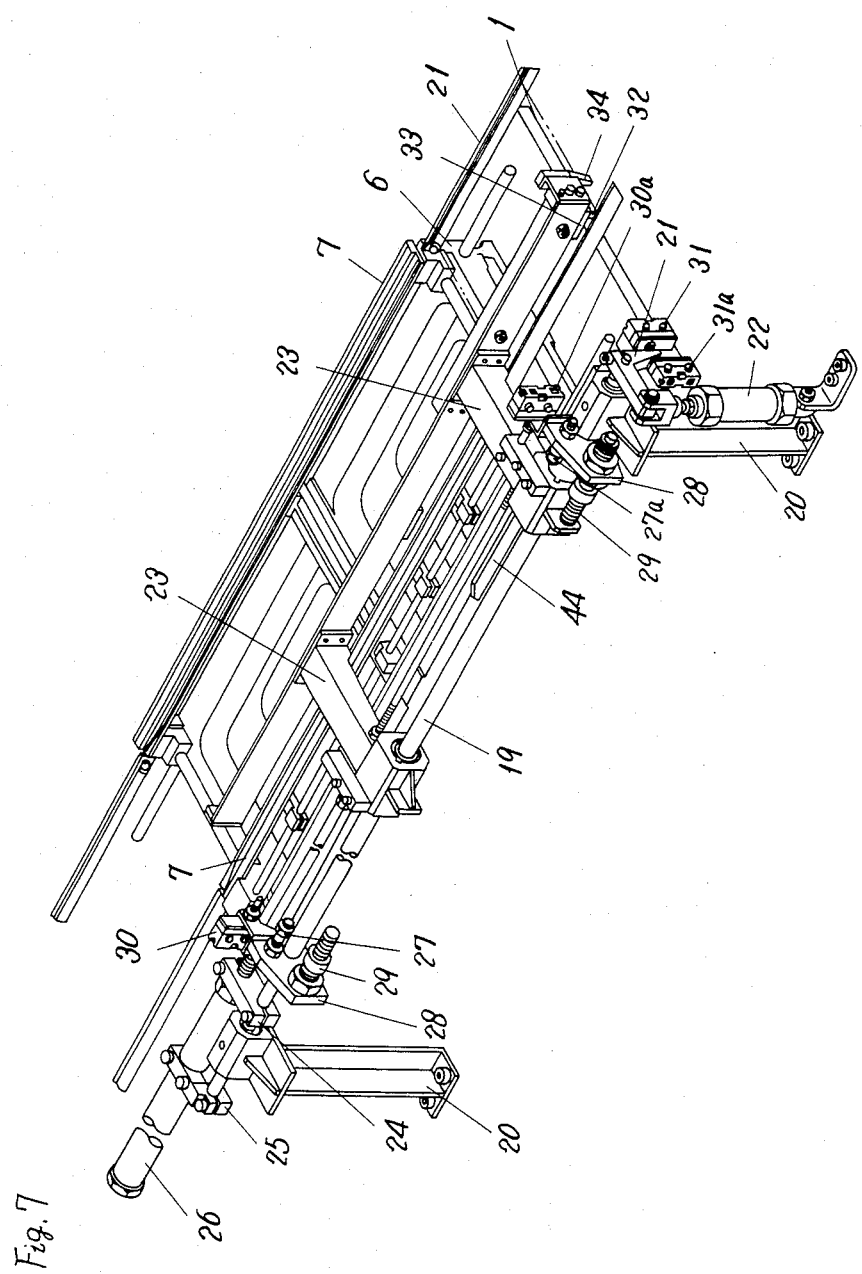
FIG. 7 is a perspective view of the automatic print board transfer apparatus.

Further, when the pin 32 is moved to predetermined down position 48 as shown in FIG. 2, the pin 32 is lowered in the following manner.

That is, when the transfer of the print board 1 is started by the pusher 34, the pin 32 is held on the print board by the cam 44 through the lever 43, rod 40, lever 45, connecting rod 38 and lever 36. When the pin 32 passes through down position 48, the cam 44 presents an inclined taper area, down which the roller 42 moves, thus swinging the lever 43. This movement of the lever 43 causes the rotation of the rod 40, so that the lever 35 is swung through the lever 45 and connecting rod 38, thus lowering the pin 32 in the Z direction.

The distance between the pusher 34 and the pin 32 is equal to the distance between the rear end of the print board 1 and the reference hole 4, so that the pin 32 is inserted into the reference hole 4.

Further, since the arm 23 is still pulled by the actuator 26, the print board 1, caught by the pin 32, is moved in the direction of arrow X'.

Then the arm 23 is decelerated by the shock absorber 29 and contacts the stop 28, thereby beginning a positioning operation. The switch 30 is turned on by the arm 23, giving a positioning signal. This signal from the switch 30 actuates the actuator 22 to return, rotating the shaft 19 to raise the arm 23, so that the pin 32 is disengaged from the reference hole 4. The print board 1 is then positioned on the X-Y table 6, and the actuator 26 moves the arm 23 in the direction opposite the X' direction until it abuts the stop 29a to complete the operation.

INDUSTRIAL APPLICABILITY

According to the present invention described so far, even when the print board is reversed, there is no need to make readjustment with respect to variations in the length of the print board in the transfer direction before transfer and positioning can be effected. Further, mixed transfer of print boards of different lengths is possible. Thus, the invention is highly beneficial.

We claim:

1. An apparatus for automatically transferring, positioning and delivering print boards onto which are to be mounted electronic elements and each of which has an end surface and a reference hole spaced from said end surface by a predetermined distance, said apparatus comprising:

transfer means for moving each print board to a predetermined position;

guides extending from said transfer means for guiding movement of the print board in a straight direction from said position;

an arm mounted for reciprocal movement in opposite directions parallel to said guides and for reciprocal pivotal movement in opposite directions generally transverse to the plane of the print board;

a pusher member integral with said arm for abutting the end surface of the print board at said position;

means for pivoting said arm toward the print board at said position such that said pusher member abuts the end surface of the print board;

means for moving said arm in said straight direction, such that said pusher member moves the print board along said guides in said direction from said position;

a pin mounted on said arm for movement relative thereto in a direction generally transverse to the plane of the print board, the center of said pin being spaced from the surface of said pusher member which abuts the end surface of the print board by a distance approximately equal to the predetermined distance between the end surface and the reference hole of the print board; and means for moving said pin downwardly with respect to said arm and thereby for inserting said pin into the reference hole of the print board, whereby movement of the print board thereafter is achieved by said pin, said pin moving means comprising a cam surface extending parallel to said guides, a roller connected to said pin, means for urging said roller into contact with said cam surface and thereby for urging said pin downwardly with respect to said arm, and a portion of said cam surface having a contour to enable downward movement of said roller and thereby said pin with respect to said arm.

2. An apparatus as claimed in claim 1, comprising a plurality of said pins positioned along said guides.

3. An apparatus as claimed in claim 1, further comprising a rod mounted for rotation about the axis thereof in said arm, said roller being fixed to a first end of said rod, a first lever fixed to a second end of said rod, a second lever rotatable about an axis parallel to said rod and connected to said pin, and a connecting rod joining said first and second levers, and wherein said urging means comprises a spring acting to bias said rod to rotate in a direction about the axis thereof to bias said roller and said pin downwardly.

* * * * *